(12) United States Patent
Kennedy et al.

(10) Patent No.: US 9,121,895 B2
(45) Date of Patent: Sep. 1, 2015

(54) TEST APPARATUS AND PALLET FOR PARALLEL RF TESTING OF PRINTED CIRCUIT BOARDS

(75) Inventors: Marc Adam Kennedy, Kitchener (CA);
Arkady Ivannikov, Mississauga (CA);
Michael Andrew Carney, Waterloo (CA)

(73) Assignee: BlackBerry Limited, Waterloo (CA)

( * ) Notice: Subject to any disclaimer, the term of this patent is extended or adjusted under 35 U.S.C. 154(b) by 456 days.

(21) Appl. No.: 13/611,362

(22) Filed: Sep. 12, 2012

(65) Prior Publication Data
US 2013/0002286 A1 Jan. 3, 2013

Related U.S. Application Data

(63) Continuation of application No. 12/689,324, filed on Jan. 19, 2010, now Pat. No. 8,289,042.

(51) Int. Cl.
*G01R 31/28* (2006.01)
(52) U.S. Cl.
CPC ........ *G01R 31/2808* (2013.01); *G01R 31/2801* (2013.01); *Y10T 29/49004* (2015.01); *Y10T 29/49764* (2015.01); *Y10T 29/53022* (2015.01)
(58) Field of Classification Search
None
See application file for complete search history.

(56) References Cited

U.S. PATENT DOCUMENTS

| | | | |
|---|---|---|---|
| 4,017,793 A * | 4/1977 | Haines | ........................ 324/750.2 |
| 4,494,095 A | 1/1985 | Noji et al. | |
| 6,525,526 B1 | 2/2003 | De Gruyter et al. | |
| 6,683,245 B1 | 1/2004 | Ogawa et al. | |
| 6,903,910 B1 | 6/2005 | Griesing et al. | |
| 7,772,505 B2 | 8/2010 | Poulsen | |
| 8,289,042 B2 | 10/2012 | Kennedy et al. | |
| 2003/0020506 A1 | 1/2003 | Prokopp | |

OTHER PUBLICATIONS

European Patent Office, "Extended European Search Report" for EP Patent Application No. 10151063.4 dated Mar. 23, 2010, Germany.
ETM Technology Limited, Online Product Information Page Re: High Quality PCB Carrier/Pallet, SMT Carriers, http://www.ete.com.cn/en/ProductShow.asp?Id=20; Dated Jan. 22, 2010.
Lastec Ltd. (Dublin), Online Article Re: SMT Stencils, Surface Mount Process Carriers, http://www.lasertec.ie/smt-stencils.php; Dated Jan. 22, 2010.

* cited by examiner

*Primary Examiner* — Minh N Tang
(74) *Attorney, Agent, or Firm* — Ridout & Maybee LLP

(57) ABSTRACT

A test apparatus features an upper RF impermeable hood and lower RF impermeable hood, wherein each of the hoods have internal dividers. When in a closed position, the hoods and dividers create two or more RF impermeable chambers. The hoods are configured to enclose or sandwich a pallet supporting two or more printed circuit boards. One of the printed circuit boards is disposed in each chamber formed by the hoods and dividers.

7 Claims, 5 Drawing Sheets

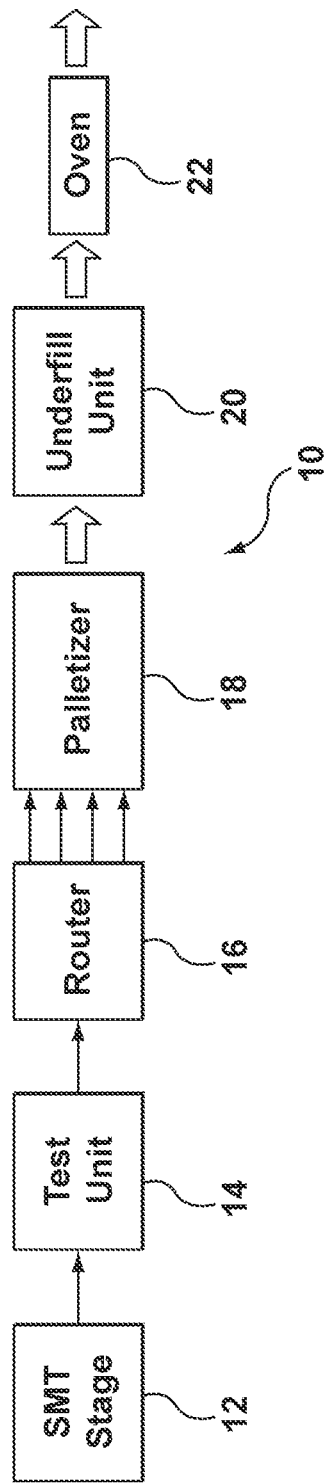
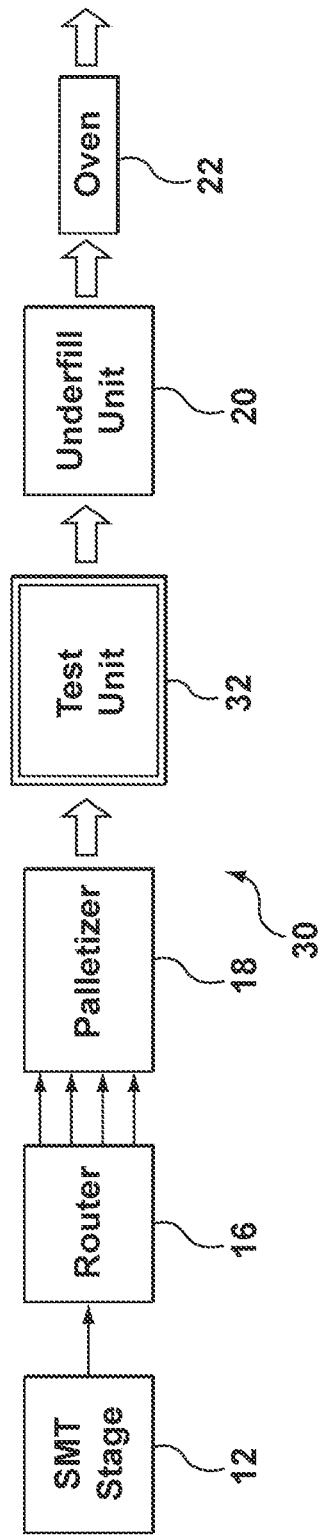

TEST APPARATUS AND PALLET FOR PARALLEL RF TESTING OF PRINTED CIRCUIT BOARDS

CROSS-REFERENCE TO RELATED APPLICATIONS

The present application is a continuation of U.S. patent application Ser. No. 12/689,324, filed Jan. 19, 2010 (now U.S. Pat. No. 8,289,042), the contents of which are hereby incorporated herein by reference.

FIELD

The present application generally relates to printed circuit board (PCB) manufacturing processes and equipment and, in particular, to a pallet and test apparatus to enable parallel RF testing of PCBs.

BACKGROUND

Manufacturing of PCBs is a highly automated process in which most operations are performed by computerized equipment in order to maximize throughput. One bottleneck in PCB manufacturing is testing of PCBs to ensure components function correctly. Some tests may be performed in parallel on multiple PCBs in a single test apparatus; however, other test, such as RF tests, must be performed serially due to interference concerns.

It would be advantageous to provide for an improved manufacturing process or test equipment that addresses, at least in part, this concern.

BRIEF DESCRIPTION OF THE DRAWINGS

Reference will now be made, by way of example, to the accompanying drawings which show example embodiments of the present application, and in which:

FIG. 1 shows an example electronic assembly line in block diagram format;

FIG. 2 shows another example embodiment of an assembly line;

Similar reference numerals may have been used in different figures to denote similar components.

DESCRIPTION OF EXAMPLE EMBODIMENTS

Figure 3:
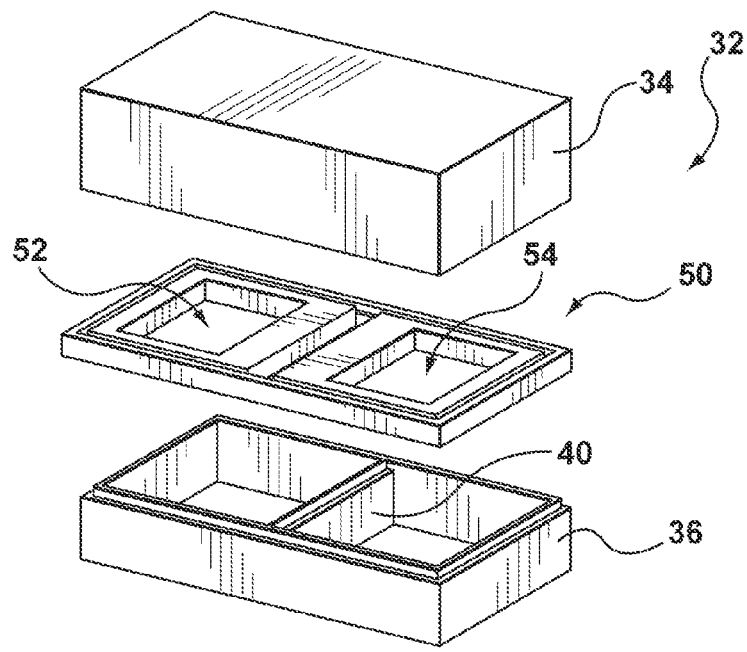
FIG. 3 shows a perspective exploded view of an example test unit.

In one aspect, the present application describes a test apparatus for parallel testing of printed circuit boards, the testing including RF testing at an RF frequency having a wavelength, the apparatus includes a pallet for holding at least two printed circuit boards; a lower RF-impermeable hood having a lower divider within its interior; and an upper RF-impermeable hood internally supporting a test probe for each printed circuit board, and having an upper divider within its interior, wherein the pallet is between the lower RF-impermeable hood and the upper RF-impermeable hood when the hoods are in a closed position. The upper and lower dividers separate adjacent printed circuit boards, and wherein the upper divider and lower divider are within one quarter of the wavelength of each other when in the closed position.

In another aspect, the present application describes a method of manufacturing an electronic assembly. The method includes mounting components to two or more printed circuit boards formed in a panel; depaneling the panel to separate each of the two or more printed circuit boards into individual printed circuit boards; palletizing at least two of the individual printed circuit boards on a pallet; and testing the palletized individual printed circuit boards in parallel. The testing includes performing parallel RF testing by placing the pallet in a test unit having RF impermeable dividers between adjacent individual printed circuit boards on the pallet.

In yet a further aspect, the present application describes a pallet for supporting two or more printed circuit boards in a manufacturing process, the process including a test unit having an upper RF impermeable hood and a lower RF impermeable hood. The pallet includes a non-conductive pallet body having an upper surface and a lower surface and defining at least two apertures, each for supporting one of the printed circuit boards. The pallet defines a divider slot between the two apertures for receiving a divider from at least one of the hoods.

In yet another aspect, the present application describes a test apparatus for parallel testing of printed circuit boards supported by a pallet, the pallet holding at least two printed circuit boards, the testing including RF testing at an RF frequency having a wavelength. The apparatus includes a lower RF-impermeable hood having a lower divider within its interior; and an upper RF-impermeable hood internally supporting a test probe for each printed circuit board, and having an upper divider within its interior, wherein the pallet is between the lower RF-impermeable hood and the upper RF-impermeable hood when the hoods are in a closed position. The upper and lower dividers separate adjacent printed circuit boards, and wherein the upper divider and lower divider are within one quarter of the wavelength of each other when in the closed position.

Electronics assembly is a highly automated process. Printed circuit boards (PCBs) are manufactured in assembly-line format with only minimal handling by human operators. In many assembly lines, surface mount technology (SMT) is used to pick and place small electrical components on individual PCBs. In a typical SMT line the PCB is "painted" with a solder paste using a stencil or other techniques to ensure solder paste is only applied to the relevant portions of the PCB. The PCB with applied solder paste is then passed through SMT machines, such as pick-and-place machines, that automatically place the individual components or integrated circuits onto the PCB. The PCB then passes through a reflow oven, which heats the PCB and causes the solder paste to melt and bond the components to the appropriate portions of the PCB. If components are to be placed on both sides of the PCB, it may be flipped over and passed through a second solder paste and SMT line, either before or after reflow.

The assembled PCB is often then tested. The test equipment usually involves various probes that connect to designated ports on the PCB for testing. The ports may disconnect certain elements of the PCB, such as an antenna for example, for the purposes of conducting testing. For example, some RF test ports disconnect a PCB antenna and then supply RF-level signals to test the RF-based circuitry on the PCB. Other testing techniques will be understood by those familiar with PCB manufacturing.

In some cases, to increase throughput and efficiency, PCBs are created in "panels" of two or more at a time. A single substrate may have four or more PCBs cut from it. Some manufacturing lines pass the entire panel through the SMT and reflow processes, so as to assemble two or more PCBs at once. The testing process is then applied to the panel as a whole, although many tests may be performed serially.

When PCBs are manufacturer in panels, they undergo a "de-paneling" where individual PCBs are separated from the panel. De-paneling may include routering, sawing, punching, or even hand-based breaking along v-lines, depending on the implementation.

In many electronic assembly lines, PCBs that have been tested and de-paneled are then "underfilled", which involves injecting an epoxy, a resin or other substance into fill holes or within cans to secure components and, in some cases, strengthen the board. In some instances, cans are filled to prevent disassembly of the PCBs to avoid reverse engineering or security compromises. Once the PCB is underfilled, it is passed through a curing oven. The curing oven cures the epoxy. The curing oven heats the PCB to a temperature sufficient to cure the epoxy but not so high as to melt the solder.

At various points in the process, PCBs that do not pass testing or visual inspections may be sent to be reworked.

After underfill and curing, the PCB may be further tested and/or used in assembling the electronic device. Suitable component connections are made and the device as a whole may be tested.

Reference is first made to FIG. 1, which shows an example electronic assembly line 10 in block diagram format. The assembly line 10 illustrates the manufacturing process for an example electronic device. The process includes an SMT stage 12, which includes solder pasting, pick-and-place, and solder reflow. In this example, the SMT stage 12 operates upon a panel that includes two or more PCBs. The panel leaves the SMT stage 12 to enter a test unit 14. The single arrow from the SMT stage 12 to the test unit 14 graphically illustrates that the panel is unbroken.

The test unit 14 includes probes for each of the PCB boards within the panel and performs certain tests in parallel. However, there are some tests that must be performed serially due to interference concerns. For example, RF tests are performed serially since RF interference from a probe on one PCB to a probe on another PCB would compromise the tests.

After the panel is tested, it is sent to a depaneller, which in this embodiment is a router 16. The router 16 separates the PCBs into individual boards. In this embodiment, the PCBs are then palletized on a single pallet by a palletizer 18. In many embodiments, palletizing is not an automated process. Rather, a human operator affixes the individual PCBs to a non-conductive (usually stone) pallet. The palletized PCBs are then transferred to an underfill unit 20 and from there to a curing oven 22. After the curing oven 22, the individual PCBs may then be removed from the pallet and be used in assembling the electronic device.

A limitation of the process depicted in FIG. 1 is that some of the testing performed by the test unit 14 must be done serially due to RF interference concerns. This limits throughput of the assembly line 10 and utilization rates of the test equipment, since only one of the plurality of test probe assemblages is in use at a time during RF testing, whilst the others sit idle.

In one possible modification of the assembly line 10 shown in FIG. 1, the test unit 14 may be used after the router 16. In other words, the router 16 separates the PCBs into individual boards and the individual boards are then tested by the test unit 14. It will be appreciated that this configuration would mean that all tests are performed serially, which would exacerbate the bottleneck problem of serial testing.

Reference is now made to FIG. 2, which shows another example embodiment of an assembly line 30. In this embodiment, the line 30 does not have the test unit 14 that tests the PCBs in the panel following the SMT stage 12. Instead, the assembly line 30 includes a test unit 32 after the palletizer 18 and before the underfill unit 20. In other words, the pallet supporting multiple PCBs is passed through the test unit 32. In this manner, the test unit 32 is capable of running parallel tests on the plurality of PCBs mounted on the pallet. This configuration may, in some instances, still suffer from the bottleneck of serial testing due to RF interference concerns. However, in the present embodiment the test unit 32 and the pallet are configured to prevent RF interference from PCB to PCB. Accordingly, the test unit 32 is able to achieve full parallel RF testing, which improves throughput of the assembly line 30.

Reference is now made to FIG. 3, which shows a perspective exploded view of an example test unit 32. The test unit 32 includes an upper RF hood 34 and a lower RF hood 36. When in a closed position, the upper RF hood 34 and lower RF hood 36 fit together as an enclosure and prevent RF interference from entering the enclosure.

A pallet 50 fits within the enclosure formed by the upper RF hood 34 and the lower RF hood 36. The pallet 50 is formed from a substance, such as stone, which can support PCBs and can withstand repeated firings within a curing oven without becoming warped or damaged. In the example shown in FIG. 3, the pallet 50 has defined within it two PCB apertures 52, 54. In some other embodiments, the pallet 50 may have three or more apertures depending on the number of PCBs it is designed to support at any one time. The interior edges of the pallet 50 that define the apertures 52, 54 may have depressions or insets into which a particular PCB is designed to fit. The pallet 50 may also have clips, posts, or other mechanical devices for securing PCBs in place over the apertures 52, 54.

The upper RF hood 34 supports test equipment (not shown), such as probes and associated circuitry, within it for engaging the PCBs when the upper RF hood 34 is in the closed position. In some cases, the lower RF hood 36 may also include test equipment (not shown), such as probes, for engaging the underside of the PCBs when the lower RF hood 36 is in the closed position.

The upper RF hood 34 includes an upper divider (not shown) and the lower RF hood 36 includes a lower divider 40. The dividers 40 separate the interior of the enclosure formed by the RF hoods 34, 36 into two chambers. The dividers 40, like the RF hoods 34, 36 themselves, are formed from an RF impermeable material. The dividers 40 are generally positioned to form one chamber housing the portion of the pallet 50 having one aperture 52 and another chamber housing the other portion of the pallet 50 having the other aperture 54. In this manner, the dividers 40 separate the interior into two chambers for holding the two PCBs supported by the pallet 50. The dividers 40 prevent RF signals from propagating from one chamber to the other, which allows simultaneous RF testing to occur within the test unit 32.

Figure 4:
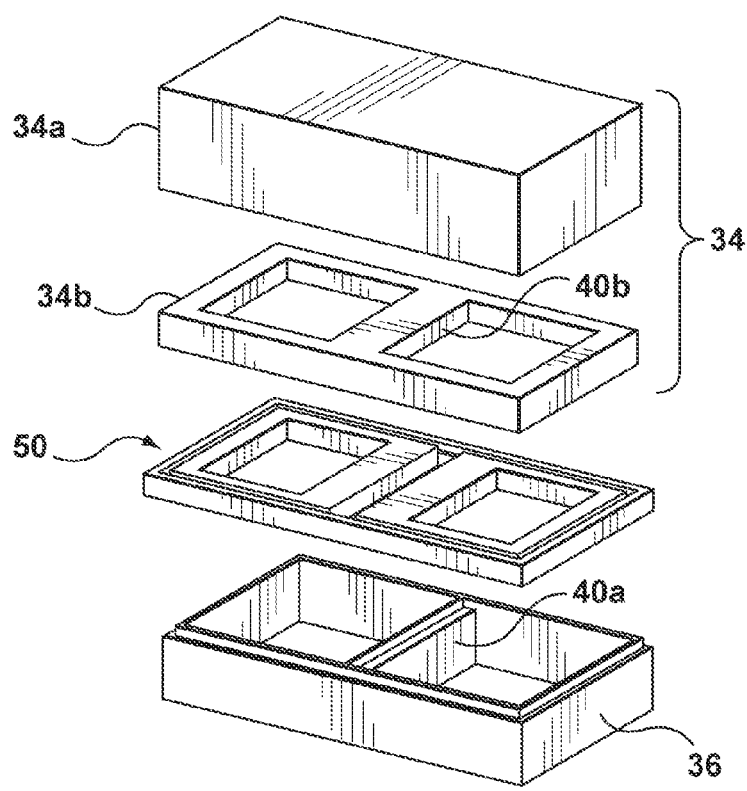
FIG. 4 shows an exploded perspective view of a further example embodiment of the test unit.

Reference is now made to FIG. 4, which shows an exploded perspective view of a further example embodiment of the test unit 32. In this embodiment, the upper RF hood 34 is separable into two parts: a top shield 34a and a test equipment chassis 34b. In some embodiments, the test equipment chassis 34b has an exterior surface designed to form part of the RF hood blocking RF interference from entering or leaving the enclosure. In such an embodiment, the top shield 34a is designed to fit atop the test equipment chassis 34b such that the test equipment chassis 34b forms the lower portion of the upper RF hood 34, as illustrated in FIG. 4. In another embodiment, however, the top shield 34a may form the entire outer surface of the upper RF hood 34 and the test equipment chassis 34b may be designed to fit within the top shield 34a.

It will be noted that the test equipment chassis 34b includes at least a portion of the upper divider 40b that separates the enclosure into two chambers.

Figure 5:
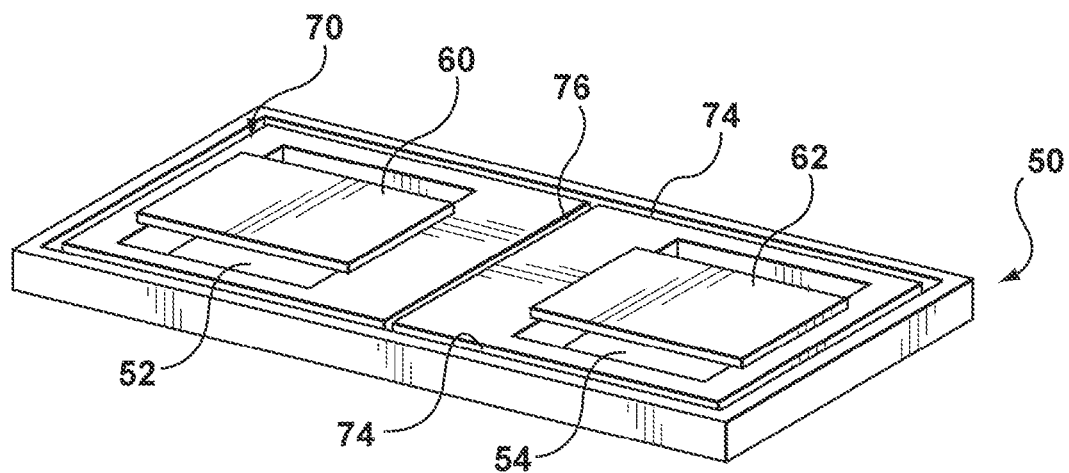
FIG. 5 shows an example pallet illustrated in perspective view.

An example pallet 50 is illustrated in perspective view in FIG. 5. As described above, the pallet 50 may be constructed of a suitable material such as stone. The pallet 50 is structured to support two or more PCBs for testing and eventual underfill and curing. Accordingly, the pallet 50 has the two or more apertures 52, 54, each for supporting a PCB board. In FIG. 5, aperture 52 supports a first PCB 60 and aperture 54 supports a second PCB 62.

The pallet 50 has an upper surface 70 and a lower surface 72 (not visible in FIG. 5). The pallet 50, in this embodiment, features an upper circumferential groove 74 in its upper surface 70. It also features an upper divider groove 76 running between the two apertures 52, 54 and extending from the circumferential groove 74 on one side of the pallet 50 to the circumferential groove 74 on the other side of the pallet 50. These grooves 74, 76, are sized to fit corresponding tongues of the upper RF hood 34 and its upper divider 40b. Corresponding, but slightly offset grooves are defined in the lower surface 72 of the pallet 50 to receive tongues of the lower RF hood 36 and its lower divider 40a. As will be described below, in embodiments in which an upper RF hood tongue and lower RF hood tongue fit into respective grooves within the pallet 50, the grooves are structured such that the tongues have a maximum gap between them. The maximum gap is no larger than one-quarter of the RF wavelength used in testing.

Figure 6:
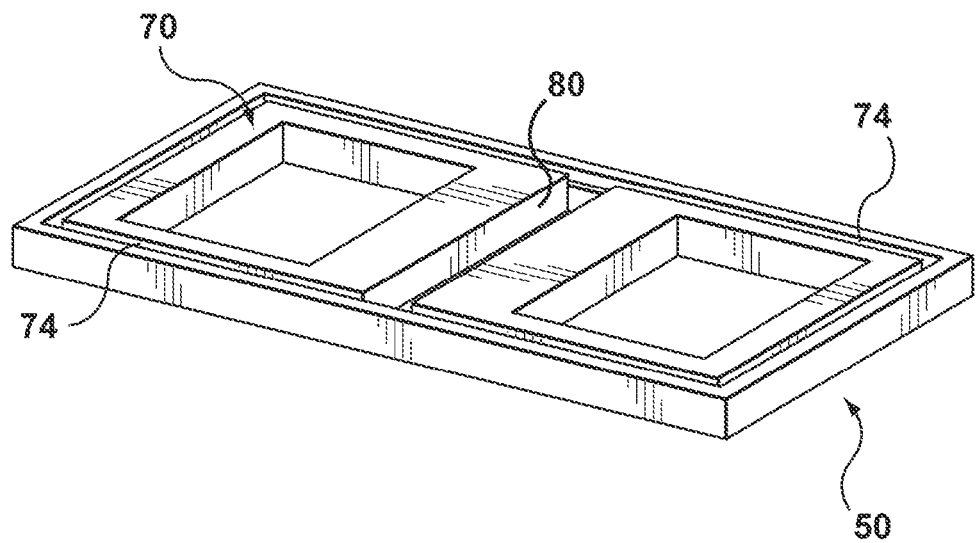
FIG. 6 shows another embodiment of the pallet.

Reference is now made to FIG. 6, which shows another embodiment of the pallet 50. In FIG. 6, instead of a divider groove 76 the pallet 50 features a divider slit 80. The divider slit 80 extends from the circumferential groove 74 on one side of the pallet 50 to the circumferential groove 74 on the other side of the pallet 50. The divider slit 80 permits the upper divider 40b and lower divider 40a to come into direct contact, thereby closing all gaps between the two chambers and blocking any possible cross-chamber RF interference.

Figure 7:
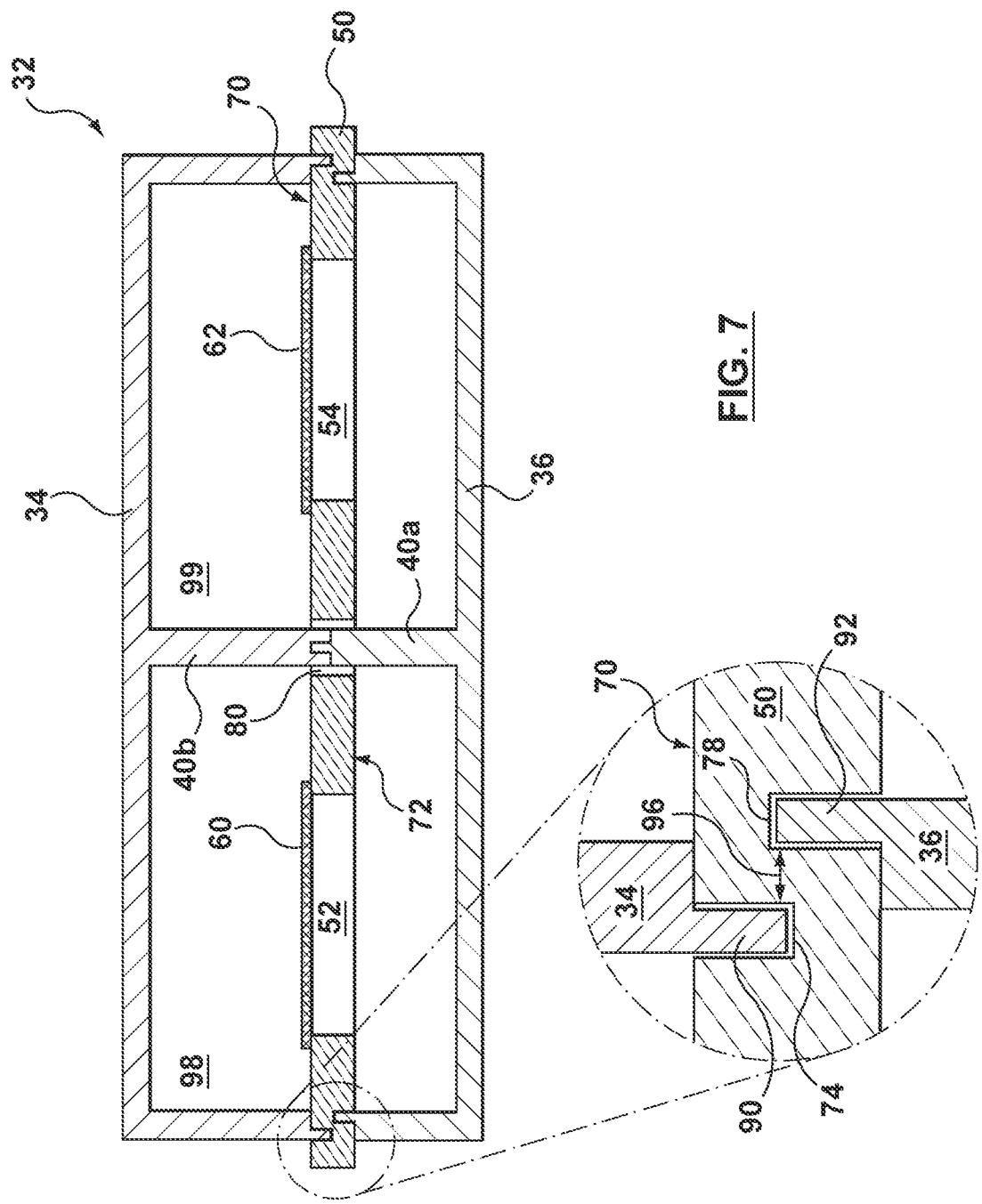
FIG. 7 shows a cross-sectional view of a first embodiment of the test unit.
Figure 8:
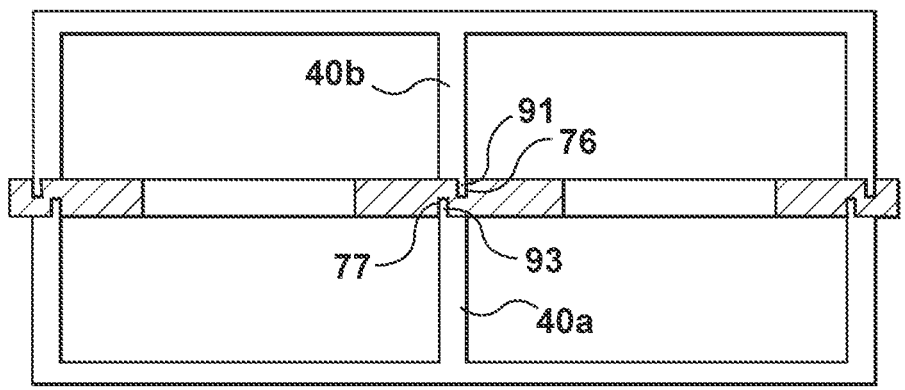
FIG. 8 shows a cross-sectional view of a second embodiment of the test unit.
Figure 9:
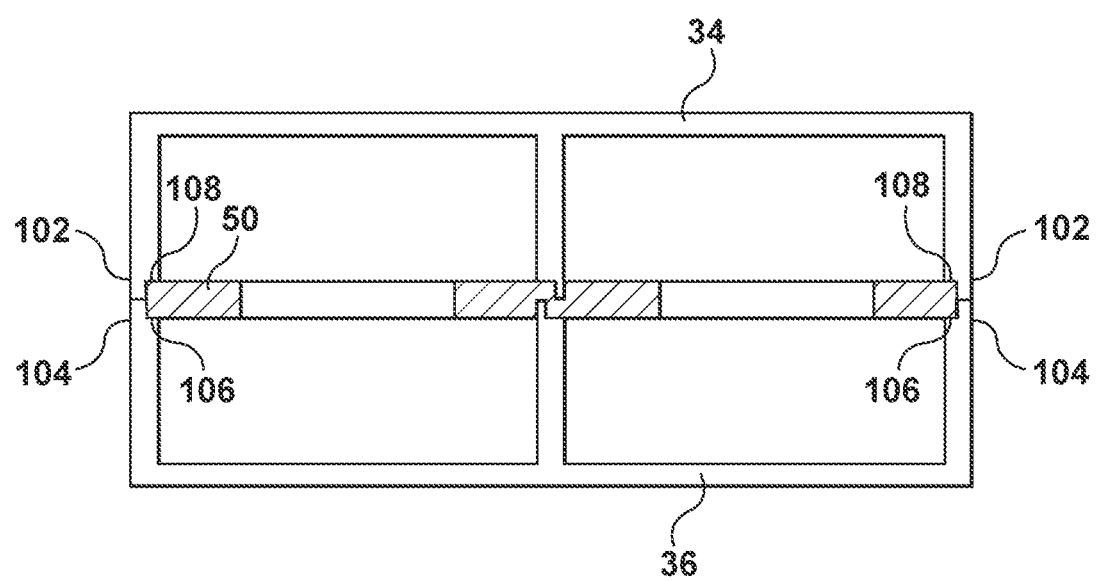
FIG. 9 shows a cross-sectional view of a third embodiment of the test unit.

Reference is now made to FIGS. 7, 8, and 9, which show cross-sectional illustrations of various embodiments of the test unit 32. FIG. 7 shows the test unit 32 includes the upper RF hood 34 and the lower RF hood 36, between which is sandwiched the pallet 50. An enlarged detailed view of a portion of the cross-section is also shown in FIG. 7.

In this embodiment, the bottom circumferential edges of the upper RF hood 34 include a downwardly depending tongue 90 sized to fit within the circumferential groove 74 formed in the upper surface 70 of the pallet 50. A bottom circumferential groove 78 is also formed in the lower surface 72 of the pallet. The bottom circumferential groove 78 is sized to accommodate an upwardly depending tongue 92 formed around the circumferential edge of the lower RF hood 36. When in the closed position, with both tongues 90, 92 inserted within their respective grooves 74, 78, the tongues 90, 92 leave a gap 96 between them. In other words, the upper and lower grooves 74, 78 and, thus, the tongues 90, 92 are offset from each other by an amount equal to the gap 96. The gap 96 is a potential entry or exit point through which RF interference might pass, since the pallet 50 is typically not made of RF impermeable material. However, in the present embodiment the grooves 74, 78 are placed such that the gap 96 is equal to or less than one-quarter wavelength of the RF signals used in testing the PCBs. Where RF signals of more than one frequency are used, the gap 96 is sized based on the smallest wavelength, i.e. based on the highest frequency signal used in the testing.

In this embodiment, the pallet 50 features the divider slit 80 allowing the upper divider 40b and the lower divider 40a to come into direct contact with each other. In this embodiment, the upper and lower dividers 40 engage each other with a tongue and groove connection. In some cases, the upper and lower dividers 40 may simply abut one another. It will be noted that in this embodiment, no gap is left between the upper divider 40b and the lower divider 40a through which RF signals might pass.

It will also be noted that the dividers 40 separate the test unit 32 into a first chamber 98 and a second chamber 99. The first chamber 98 contains the portion of the pallet 50 having the first aperture 52 and the second chamber 99 contains the portion of the pallet 50 having the second aperture 54. The portion of the pallet 50 in the first chamber 98 supports the first PCB 60 and the portion of the pallet 50 in the second chamber 99 supports the second PCB 62. Each chamber 98, 99 contains test equipment, such as probes, for initiating test operations on the PCBs 60, 62.

When opened, the upper RF hood 34 is retracted upwards away from the pallet 50. In some embodiments, another mechanical structure may support the edges of the pallet 50 whilst the lower RF hood 36 is retracted downwards away from the pallet 50. In either case, the pallet 50 is extracted from between the two RF hoods 34, 36 for removal from the test unit 32. The extraction of the pallet 50 from the test unit 32 may be automated or may rely on a human operator.

Reference is now made to FIG. 8, which shows a cross-section of an alternative embodiment of the test unit 32. In this embodiment, the pallet 50 does not have a divider slit 80 (FIG. 7), but instead features the upper divider slot 76 and a lower divider slot 77. The upper divider 40b includes a downwardly depending divider tongue 91 sized to fit within the upper divider slot 76, and the lower divider 40a includes an upwardly depending divider tongue 93 sized to fit within the lower divider slot 77. The two divider tongues 91, 93 define a gap therebetween having a maximum size of one-quarter wavelength of the highest RF frequency used in testing, as described above. The test unit 32 is otherwise similar to the test unit 32 shown in FIG. 7.

Reference is now made to FIG. 9, which shows a cross-section of a further embodiment of the test unit 32. In this embodiment, the pallet 50 features the upper and lower divider slots 76, 77 described above in connection with FIG. 8; however, it does not have the upper and lower circumferential slots 74, 78. Instead, the pallet 50 in this embodiment is smaller in size than the peripheral size of the upper and lower RF hood 34, 36, such that the pallet 50 fits entirely within the test unit 32 when the test unit 32 is in the closed position. In this embodiment, the bottom outer edge 102 of the upper RF hood 34 physically meets the top outer edge 104 of the lower RF hood 36. A shelf 106 may be formed along at least some of the internal periphery of the edge of the lower RF hood 36 for physically supporting the pallet 50 within the test unit 32. A corresponding cutout 108 may be formed along at least some of the internal periphery of the edge of the upper RF hood 34 for accommodating the top circumferential edges of the pallet 50.

Although only three possible embodiments of test unit 32 are described in FIGS. 7, 8 and 9, it will be appreciated that various features of these embodiment may be combined to realize other embodiments achieving the same function of separating the test unit 32 into two or more chambers having RF-impermeable barriers therebetween.

It will be understood that although many of the foregoing embodiments described a test unit enclosure divided into two chambers, in some embodiments the test unit enclosure may be divided into as many chambers as there are PCBs to test on a given pallet. For example, some pallets may be designed to support four PCBs. In such a case, the test unit may have three dividers for separating the enclosure into four chambers arranged side-by-side. Alternatively, the pallet and test unit may be structure to have the PCBs in a 2×2 grid, in which case the test unit may have upper and lower RF hoods with dividers arranged in to divide the enclosure into four chambers in a grid. Other variations will be understood by those ordinarily skilled in the art.

Certain adaptations and modifications of the described embodiments can be made. Therefore, the above discussed embodiments are considered to be illustrative and not restrictive.

What is claimed is:

1. A test apparatus for parallel testing of printed circuit boards supported by a pallet, the pallet holding at least two printed circuit boards, the testing including RF testing at an RF frequency having a wavelength, the apparatus comprising:
   a lower RF-impermeable hood having a lower divider within its interior, the lower RF-impermeable hood having top outer edge around the periphery of the lower RF-impermeable hood; and
   an upper RF-impermeable hood internally supporting a test probe for each printed circuit board, and having an upper divider within its interior, wherein the pallet is between the lower RF-impermeable hood and the upper RF-impermeable hood when the hoods are in a closed position, the upper RF-impermeable hood having bottom outer edge around the periphery of the upper RF-impermeable hood, the top outer edge physically meeting the bottom outer edge when in the closed position,
   and wherein the upper and lower dividers separate adjacent printed circuit boards, and wherein the upper divider and lower divider are within one quarter of the wavelength of each other when in the closed position.

2. The test apparatus claimed in claim 1 wherein the upper RF-impermeable hood, the lower RF-impermeable hood, the upper divider and the lower divider define at least two chambers when in the closed position, each chamber containing a portion of the pallet supporting one of the at least two printed circuit boards.

3. The test apparatus claimed in claim 1 wherein at least some of the internal periphery of the lower RF-impermeable hood includes a shelf for physically supporting the pallet.

4. The test apparatus claimed in claim 3 wherein at least some of the internal periphery of the upper RF-impermeable hood includes a cutout corresponding to the shelf for accommodating top circumferential edges of the pallet.

5. A method of testing an electronic assembly, comprising:
   mounting components to a first printed circuit board formed in a panel;
   mounting further components to a second printed circuit board formed in the panel;
   separating the first printed circuit board from the panel;
   separating the second printed circuit board from the panel;
   mounting the first printed circuit board on a pallet;
   mounting the second printed circuit board on the pallet;
   placing the pallet, with the first printed circuit board and the second printed circuit board, in a test unit having RF-impermeable chambers isolating the first printed circuit board from the second printed circuit board, wherein placing the pallet in the test unit includes enclosing the pallet within an enclosure formed by:
   an upper RF-impermeable hood; and
   a lower RF-impermeable hood,
      wherein the hoods each include respective RF-impermeable dividers defining the RF-impermeable chambers;
   testing the first printed circuit board; and
   testing the second printed circuit board in parallel with the testing of the first printed circuit board.

6. The method claimed in claim 5, wherein one of the RF-impermeable chambers containing the first printed circuit board, another of the RF-impermeable chambers containing the second printed circuit board.

7. A non-conductive pallet comprising:
   a first portion that defines a first aperture configured to support a first printed circuit board;
   a second portion that defines a second aperture configured to support a second printed circuit board;
   an upper surface that includes an upper divider groove extending between the first aperture and the second aperture, wherein the upper divider groove is configured to receive a tongue of an upper divider of an upper hood; and
   a lower surface that includes a lower divider groove extending between the first aperture and the second aperture, wherein the lower divider groove is configured to receive a tongue of a lower divider of a lower hood.

* * * * *